(12) United States Patent
Sinclair et al.

(10) Patent No.: US 9,905,396 B1
(45) Date of Patent: Feb. 27, 2018

(54) CURVED POST SCAN ELECTRODE

(71) Applicant: Varian Semiconductor Equipment Associates, Inc., Gloucester, MA (US)

(72) Inventors: Frank Sinclair, Boston, MA (US); Daniel Tieger, Manchester, MA (US); Edward W. Bell, Newbury, MA (US); Robert Lindberg, Rockport, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/296,242

(22) Filed: Oct. 18, 2016

(51) Int. Cl.
| | |
|---|---|
| *H01J 3/26* | (2006.01) |
| *H01J 23/09* | (2006.01) |
| *H01J 27/02* | (2006.01) |
| *G21K 5/02* | (2006.01) |
| *H01J 37/317* | (2006.01) |
| *H01J 37/08* | (2006.01) |

(52) U.S. Cl.
CPC .......... *H01J 37/3171* (2013.01); *H01J 37/08* (2013.01); *H01J 2237/0475* (2013.01)

(58) Field of Classification Search
CPC .......... H01J 27/02; H01J 27/022; H01J 37/08; H01J 37/1472; H01J 37/1474
USPC ............ 250/423 R, 424, 492.1, 492.2, 492.3
See application file for complete search history.

(56) References Cited

U.S. PATENT DOCUMENTS

| | | | |
|---|---|---|---|
| 5,317,161 A * | 5/1994 | Chalupka ................ | H01J 27/10 250/423 R |
| 5,932,882 A | 8/1999 | England et al. | |
| 6,075,249 A | 6/2000 | Olson | |
| 6,998,625 B1 | 2/2006 | McKenna et al. | |
| 8,309,935 B2 | 11/2012 | Sinclair et al. | |
| 2002/0043621 A1* | 4/2002 | Aitken .................... | H01J 37/05 250/281 |
| 2010/0243879 A1* | 9/2010 | Huang .................... | H01J 37/05 250/281 |

\* cited by examiner

*Primary Examiner* — Nicole Ippolito

(57) ABSTRACT

An apparatus an ion beam generator to provide an ion beam. A scanning system may receive the ion beam and provide a scanned beam. An electrode may receive the scanned beam. At least a portion of the electrode is normal to a propagation direction of the scanned beam. The portion of the electrode that is normal to the propagation direction the scan beam may have a curved shape.

17 Claims, 3 Drawing Sheets

300

```
Generate an ion beam.
302
```

```
Receive the ion beam and provide a
scanned beam from the ion beam.
304
```

```
Receive the scanned beam by an
electrode having a portion that is normal
to a propagation direction of the scanned
beam.
306
```

FIG. 3

CURVED POST SCAN ELECTRODE

BACKGROUND

Field

This disclosure relates to ion implantation and, more particularly, to an ion implanter with a post scan suppression electrode.

Description of Related Art

Ion implantation is a standard technique for introducing conductivity into semiconductor wafers. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity.

An ion implanter may include a scanner for deflecting or scanning the ion beam in at least one direction at a scan frequency in order to distribute the ion beam over the front surface of the wafer. The scanner may be an electrostatic scanner or a magnetic scanner as are known in the art. The ion beam may be distributed over the wafer area by the beam scanning alone or by a combination of beam scanning and wafer movement. In one ion implanter, the scanner may scan the beam in one direction and a drive system may translate the wafer in a direction orthogonal to the scan direction to distribute the ion beam over the front surface of the wafer.

A conventional scanner may include scan electrodes in the form of scan plates positioned on opposite sides of an ion beam provided by an ion beam generator. A post scan electrode may be positioned downstream of the scan plates, and a prescan suppression electrode may be positioned upstream of the scan plates. The terms "upstream" and "downstream" are referenced to the direction of ion beam transport. Thus, the post scan electrode is positioned between the scan plates and an angle corrector of the scanner, and the prescan suppression electrode is positioned between the scan plates and the ion beam generator.

The scan plates scan the ion beam in one dimension to provide a fan-shaped beam envelope whose trajectories downstream of the deflection region and post scan suppression are substantially straight lines. These straight lines can be extended backwards and intersect at a point. The point is referred to as the actual scan origin. The ion beam processed by the scan plates is received by the post scan electrode. The conventional scanner uses a flat post scan electrode. The flat post scan electrode causes an undesirable shift of the apparent scan origin. The apparent scan origin should be the same or substantially as the actual scan origin. The undesirable downstream shift of the apparent scan origin compared to the actual scan origin is caused by beam refraction associated with the flat post scan electrode. The apparent scan origin shift forces a higher collimator field needed to achieve beam parallelism. The higher collimator filed drives an undesirable change in the beam angle that compromises dosimetry accuracy and other process parameters.

Accordingly, there is a need for an ion implanter that does not shift the scan origin of the fan-shaped beam envelope provided by scan plates.

SUMMARY

This Summary is provided to introduce a selection of concepts in a simplified form further described below in the Detailed Description. This Summary is not intended to identify key or essential features of the claimed subject matter, nor is this Summary intended as an aid in determining the scope of the claimed subject matter.

In one embodiment, an apparatus is provided that includes an ion beam generator to provide an ion beam. A scanning system may receive the ion beam and provide a scanned beam. An electrode may receive the scanned beam. At least a portion of the electrode is normal to a propagation direction of the scanned beam. In one embodiment, the at least the portion of the electrode that is normal to the propagation direction the scan beam has a curved shape.

In another embodiment, an apparatus is provided that includes an ion beam generator to provide an ion beam. A scanning system may receive the ion beam and provide a scanned beam. An electrode may receive the scanned beam. At least a portion of the electrode has a curved shape.

In yet another embodiment, a method is provided that generates an ion beam. The method may further include receiving the ion beam and providing a scanned beam from the ion beam, and receiving the scanned beam by an electrode, at least a portion of the electrode is normal to a propagation direction of the scanned beam.

In another embodiment, an apparatus may include an ion beam generator to provide an ion beam. Furthermore, the apparatus may include a scanning system to receive the ion beam, the scanning system including first and second scan plates positioned on opposite sides of the ion beam, the first and second scan plates to generate a scanned beam from the ion beam, the scanned beam having a scan origin and an apparent scan origin. The electrode may receive the scanned beam, at least a portion of the electrode has a curved shape to substantially maintain a position of the apparent scan origin. In one embodiment, a deceleration lens may be disposed upstream of the first and second scan plates.

In another embodiment, a method may include generating an ion beam and receiving the ion beam and providing a scanned beam from the ion beam, the scanned beam having a scan origin and an apparent scan origin. The method may further include receiving the scanned beam by a curved electrode, a position of the apparent scan origin of the scanned beam substantially maintained as the scanned beam passes through the curved electrode.

BRIEF DESCRIPTION OF THE DRAWINGS

FIG. 3 illustrates an exemplary set of operations for to process an ion beam.

DETAILED DESCRIPTION

Figure 1:
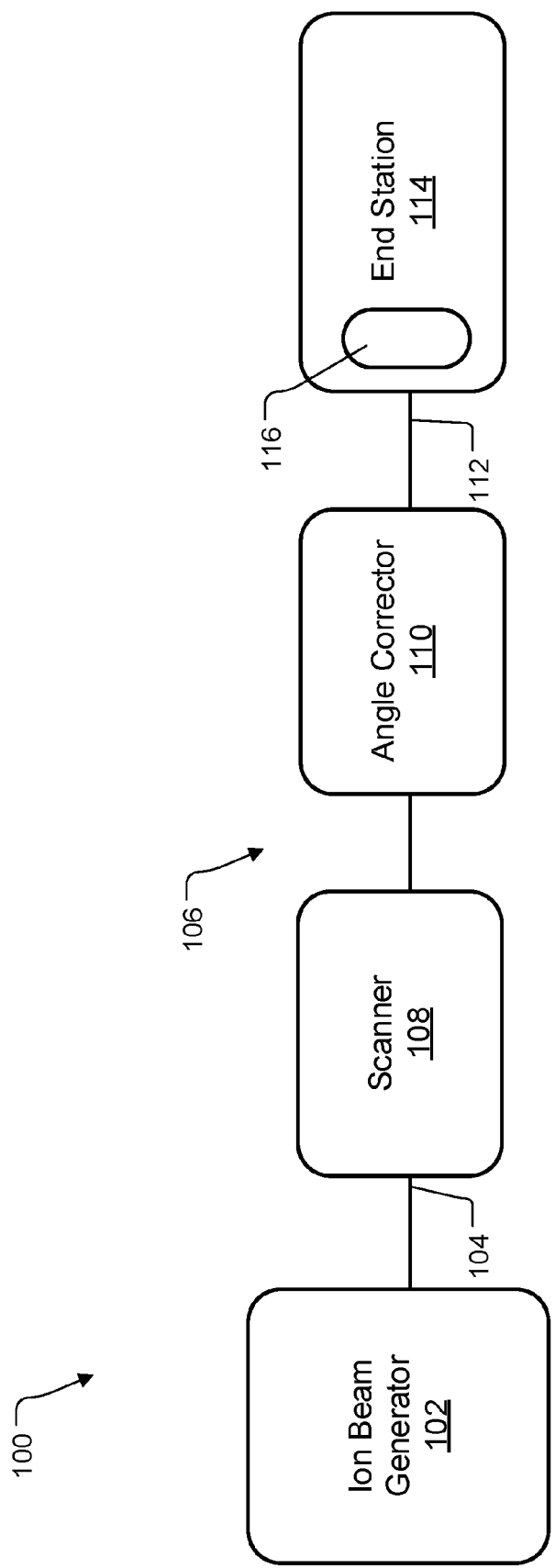
FIG. 1 is a simplified block diagram of an ion implanter system in accordance with an exemplary embodiment.

A simplified block diagram of an ion implanter system 100 incorporating an exemplary embodiment is shown in FIG. 1. An ion beam generator 102 may generate an ion beam 104 of a desired species, accelerate ions in the ion beam 104 to desired energies, perform mass/energy analysis of the ion beam 104 to remove energy and mass contaminants, and supply the ion beam 104 having a low level of energy and mass contaminants. A scanning system 106 may include a scanner 108 and an angle corrector 110. The scanning system 106 deflects the ion beam 104 to produce a scanned ion beam 112. An end station 114 supports a semiconductor wafer 116 or other workpiece in the path of scanned ion beam 112, such that ions of the desired species are implanted into the semiconductor wafer 116. The ion implanter system 100 may include additional components well known to those skilled in the art. For example, the end station 114 may include automated wafer handling equipment for introducing wafers into the ion implanter system 100 and for removing wafers after implantation, a dose measuring system, an electron flood gun, etc.

Figure 2:
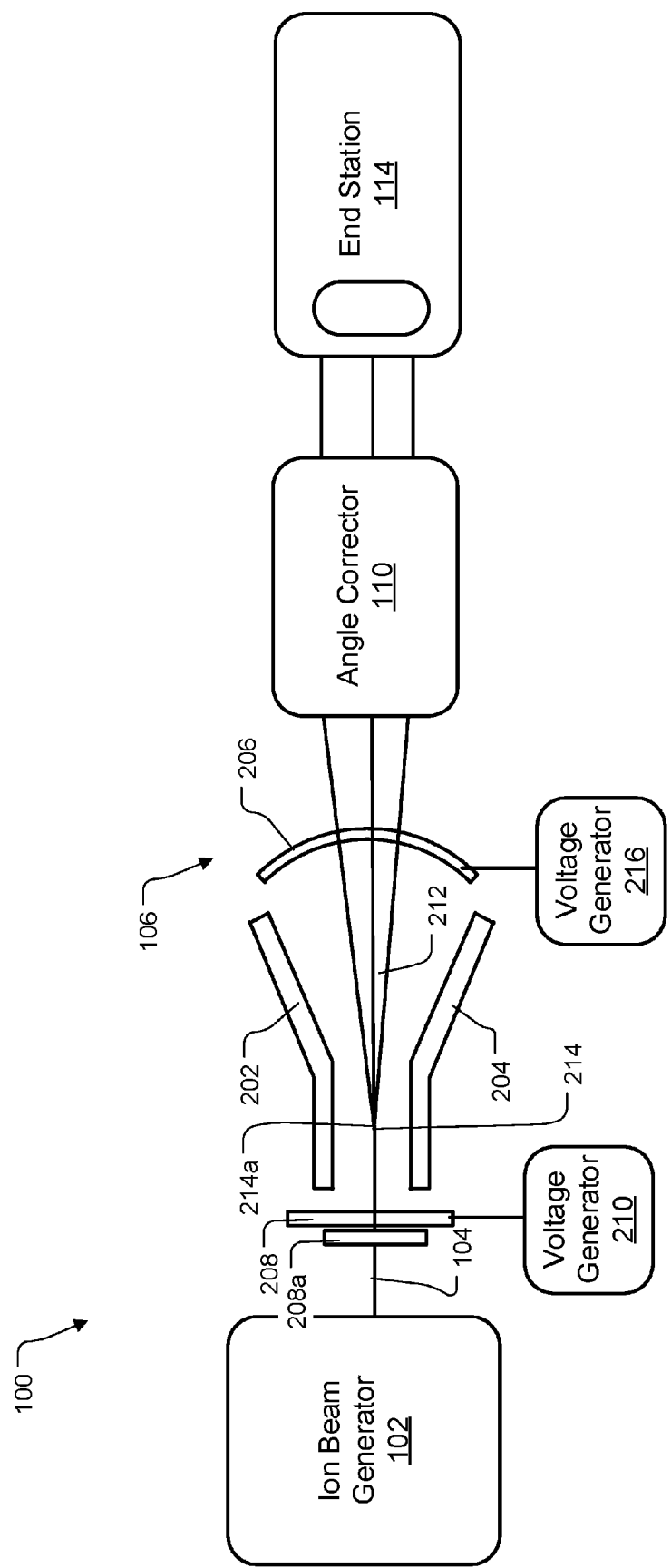
FIG. 2 is a schematic block diagram illustrating further details of the ion implanter system illustrated in FIG. 1.

FIG. 2 is a schematic block diagram illustrating further details of the ion implanter system 100 illustrated in FIG. 1. In particular, additional details of the scanning system 106 are illustrated in FIG. 2. The scanning system 106 may include scan electrodes in the form of scan plates 202 and 204. The scan plates 202 and 204 are positioned on opposite sides of the ion beam 104. The scan plates 202 and 204 include parallel portions and diverging portions that are downstream of the parallel portions.

The scanning system 106 may further include a post scan electrode 206 that is downstream of the scan plates 202 and 204. As is illustrated, the post scan electrode 206 is shaped. In one embodiment, the post scan electrode 206 has a curved or arced shape, or at least a portion of the post scan electrode 206 has a curved or arced shape. For example, the post scan electrode 206 may have a substantially straight portion and a curved portion. The post scan electrode 206 may be coupled to a post scan suppression voltage generator 216. In one embodiment, the post scan electrode 206 is positioned directly adjacent to the scan plates 202 and 204.

Additionally, the scanning system 106 may include a prescan electrode 208. The prescan electrode 208 is upstream of the scan plates 202 and 204. The prescan electrode 208 may be coupled to a prescan suppression voltage generator 210. A decel lens 208a may be positioned downstream or upstream of the prescan electrode 208. The decel lens 208a may be a terode decel lens designed to decelerate the ion beam 104, so that the ion beam 104 is more parallel or convergent. In one embodiment, the decel lens 208a and the prescan electrode 208 are integrated as one element.

The prescan electrode 208 may include an aperture for passage of the ion beam 104 therethrough. The aperture of the prescan electrode 208 may be utilized to minimize sputtering and wafer contamination. The dimensions associated with the aperture of the prescan electrode 208 may be selected to provide clearance for the ion beam 104 sufficient to minimize sputtering, while controlling migration of electrons toward the scan plates 202 and 204. The prescan electrode 208 may be coupled to a prescan suppression voltage generator 210.

The scan plates 202 and 204 may be functional to provide a fan-shaped beam envelope 212. As is illustrated, the fan-shaped beam envelope 212 increases in width as the beam envelope 212 passes through the scan plates 202 and 204. The scan plates 202 and 204 are shaped so as to maintain a relatively constant spacing from the fan-shaped beam envelope 212. Generally, the fan-shaped beam envelope 212 begins at an actual scan origin 214. As described in the following, the use of at least the post scan electrode 206 having a curved or arced shape substantially maintains an apparent scan origin 214a at the same position of the actual scan origin 214. In one embodiment, the apparent scan origin 214a overlays the actual scan origin 214.

Maintaining the apparent scan origin 214a at substantially the same position as the actual scan origin 214 as the fan-shaped beam envelope 212 passes through the post scan electrode 206 may be beneficial. In one embodiment, the fan-shaped beam envelope 212 passes through at least the curved or arc portion of the post scan electrode 206. Use of the post scan electrode 206, having the illustrated curved or arc shape, ensures that the actual scan origin 214 and the apparent scan origin 214a remain the same or substantially the same as the fan-shaped beam envelope 212 passes through the post scan electrode 206. By using the post scan electrode 206 having a shape (e.g., a curved shape) that is normal to the fan-shaped beam envelope 212 propagation direction, a refractive shift of the apparent scan origin 214a compared to the scan origin 214 may be advantageously avoided. In other words, without the use of the post scan electrode 206 having a curved or arc shape, rather the use of a conventional post scan electrode having a flat shape, a shift in the apparent scan origin 214a would occur. Such a shift in the apparent scan origin 214a would be seen downstream of the actual scan origin 214, and such a shift in the apparent scan origin 214a undesirably forces a higher collimator field needed to achieve beam parallelism at the end station 114. The higher collimator field may drive an undesirable change in the beam angle that compromises dosimetry accuracy and other process parameters.

Other advantages are realized by using the post scan electrode 206 having the curved or arc shape. For example, use of the post scan electrode 206 having the curved or arc shape allows for the use of significantly higher voltages on the scan plates 202 and 204 and the post scan electrode 206, compared those used in conventional scanning systems. More particularly, voltages applied to the scan plates and post scan electrode of conventional scanning systems may cause the undesirable shift in the apparent scan origin 214a. Therefore, conventional scanning systems may be required to use lower than desirable scan plate and post scan electrode voltages in order to mitigate against the shifting of the apparent scan origin 214a. In comparison, the geometry of the post scan electrode 206 having the curved or arc shape allows for the use of significant voltages on the scan plates 202 and 204 and the post scan electrode 206, and use of the significant voltages does not substantially change the apparent scan origin 214a. In one example, the post scan suppression voltage generator 216 may apply a voltage of up to 9 kV to the post scan electrode 206, while the apparent scan origin 214a remains substantially at the same position as the scan origin 214.

FIG. 3 illustrates an exemplary set of operations 300 to process an ion beam. The exemplary set of operations may be performed by an ion implanter system, such as the ion implanter system 100 illustrated in FIGS. 1-2. At block 302, an ion beam is generated. At block 304, the ion beam is received and a scanned beam is provided from the ion beam. At block 306, the scanned beam is received by an electrode. The electrode has a portion that is normal to a propagation direction of the scanned beam. In one embodiment, the electrode has a curved or arced shape.

By using a post scan electrode having a shape (e.g., a curved shape) that is normal to the fan-shaped beam envelope propagation direction, a refractive shift of the apparent scan origin compared to the scan origin may be advantageously avoided. In other words, without the use of the post scan electrode having a curved or arc shape, rather the use of a conventional post scan electrode having a flat shape, a shift in the apparent scan origin would occur. Other advantages are realized by using the post scan electrode having the curved or arc shape. For example, use of the post scan electrode having the curved or arc shape allows for the use of significantly higher voltages on the scan plates and the post scan electrode, compared those used in conventional scanning systems.

While exemplary ion implanter devices and methods are disclosed, it will be understood by those skilled in the art that various changes may be made and equivalents may be substituted without departing from the spirit and scope of the claims of the application. Other modifications may be made to adapt a particular situation or material to the teachings disclosed above without departing from the scope of the claims. Therefore, the claims should not be construed as being limited to any one of the particular embodiments disclosed, but to any embodiments that fall within the scope of the claims.

We claim:

1. An apparatus, comprising:
   an ion beam generator to provide an ion beam;
   a scanning system to receive the ion beam, the scanning system including first and second scan plates positioned on opposite sides of the ion beam, the first and second scan plates to generate a scanned beam from the ion beam, the scanned beam having a scan origin and an apparent scan origin; and
   an electrode to receive the scanned beam, at least a portion of the electrode has a curved shape to substantially maintain a position of the apparent scan origin.

2. The apparatus according to claim 1, wherein the electrode is downstream of the scanning system and is positioned directly adjacent to the first and second scan plates of the scanning system.

3. The apparatus according to claim 1, wherein the electrode is downstream of the scanning system.

4. The apparatus according to claim 1, wherein the first and second scan plates comprise parallel portions and diverging portions downstream of the parallel portions.

5. The apparatus according to claim 1, further comprising a prescan electrode positioned upstream of the electrode.

6. The apparatus according to claim 1, wherein the scanned beam has a fan-shaped beam envelope, the fan-shaped beam envelope beginning at the scan origin and received by the electrode, and wherein the apparent scan origin overlaps the scan origin.

7. A method, comprising:
   generating an ion beam;
   receiving the ion beam and providing a scanned beam from the ion beam, the scanned beam having a scan origin and an apparent scan origin; and
   receiving the scanned beam by a curved electrode, a position of the apparent scan origin of the scanned beam substantially maintained as the scanned beam passes through the curved electrode.

8. The method according to claim 7, wherein a scanning system comprising first and second scan plates positioned on opposite sides of the ion beam receives the ion beam and provides the scanned beam from the ion beam.

9. The method according to claim 8, wherein the first and second scan plates comprise parallel portions and diverging portions downstream of the parallel portions.

10. The method according to claim 8, wherein the scan origin and the apparent scan origin of the scanned beam are positioned between the first and second scan plates.

11. The method according to claim 8, wherein the scanned beam has a fan-shaped beam envelope, the fan-shaped beam envelope beginning at the scan origin and wherein the apparent scan origin overlaps the scan origin.

12. An apparatus, comprising:
   an ion beam generator to provide an ion beam;
   a scanning system to receive the ion beam, the scanning system including:
      first and second scan plates positioned on opposite sides of the ion beam, the first and second scan plates to generate a scanned beam from the ion beam, the scanned beam having a scan origin and an apparent scan origin,
      a deceleration lens disposed upstream of the first and second scan plate, the deceleration lens to decelerate the ion beam; and
   an electrode to receive the scanned beam, at least a portion of the electrode has a curved shape to substantially maintain a position of the apparent scan origin.

13. The apparatus according to claim 12, wherein the electrode is downstream of the scanning system and is positioned directly adjacent to the first and second scan plates of the scanning system.

14. The apparatus according to claim 12, wherein the electrode is downstream of the scanning system.

15. The apparatus according to claim 12, wherein the first and second scan plates comprise parallel portions and diverging portions downstream of the parallel portions.

16. The apparatus according to claim 12, further comprising a prescan electrode disposed upstream of the electrode.

17. The apparatus according to claim 12, wherein the scanned beam has a fan-shaped beam envelope, the fan-shaped beam envelope beginning at the scan origin and received by the electrode, and wherein the apparent scan origin overlaps the scan origin.

* * * * *